(12) United States Patent
Owen

(10) Patent No.: US 6,829,164 B2
(45) Date of Patent: Dec. 7, 2004

(54) DIFFERENTIAL FLOATING GATE CIRCUIT AND METHOD FOR PROGRAMMING

(75) Inventor: William H. Owen, Los Altos Hills, CA (US)

(73) Assignee: Xicor Corporation, Milpitas, CA (US)

( * ) Notice: Subject to any disclaimer, the term of this patent is extended or adjusted under 35 U.S.C. 154(b) by 0 days.

(21) Appl. No.: 10/367,337

(22) Filed: Feb. 14, 2003

(65) Prior Publication Data

US 2004/0160823 A1 Aug. 19, 2004

(51) Int. Cl.⁷ .............................................. G11C 16/04
(52) U.S. Cl. ........................... 365/185.05; 365/185.03; 365/185.21
(58) Field of Search ....................... 365/185.05, 185.03, 365/185.21; 327/335, 556, 427

(56) References Cited

U.S. PATENT DOCUMENTS

| | | | |
|---|---|---|---|
| 4,935,702 A | 6/1990 | Mead et al. | 330/9 |
| 4,953,928 A | 9/1990 | Anderson et al. | 357/23.5 |
| 4,980,859 A | 12/1990 | Guterman et al. | 365/154 |
| 5,059,920 A | 10/1991 | Anderson et al. | 330/253 |
| 5,095,284 A | 3/1992 | Mead | 330/253 |
| 5,166,562 A | 11/1992 | Allen et al. | 307/571 |
| 5,253,196 A * | 10/1993 | Shimabukuro et al. | 365/185.04 |
| 5,875,126 A | 2/1999 | Minch et al. | 365/185.01 |
| 5,986,927 A | 11/1999 | Minch et al. | 365/185.1 |
| 6,297,689 B1 | 10/2001 | Merrill | 327/540 |

OTHER PUBLICATIONS

Fowler, et al., "Electron Emission In Intense Electric Fields",Royal Soc. Proc., A, vol. 119 (1928).

Lenzlinger, et al., "Fowler–Nordheim Tunnelling Into Thermally Grown SiO₂", Applied Physics, Vo. 40, No. 1 (Jan. 1969).

Carley, "Trimming Analog Circuits Using Floating–Gate Analog MOS Memory", IEEE Journal of Solid–State Circuits, vol. 24, No. 6 (Dec. 1989).

Hasler, et al. "Adaptive Circuits Using pFET Floating–Gate Devices", pp. 1–15 (undated).

Figueroa, et al., "A Floating–Gate Trimmable High Resolution DAC In Standard 0.25μm CMOS", Nonvolatile Semiconductor Memory Workshop, pp. 46–47 (Aug. 2001).

* cited by examiner

Primary Examiner—Vu A. Le
(74) Attorney, Agent, or Firm—Coudert Brothers LLP

(57) ABSTRACT

A method and circuit for programming a floating gate in a differential floating gate circuit to an input set voltage. The circuit includes a differential amplifier circuit for comparing the voltage on a floating gate with an input set voltage, and a gain stage for amplifying any voltage differential between those two voltages. During a set mode, an erase and a program tunnel device operate in a dual conduction mode for modifying the voltage on the floating gate. The output at the gain stage is used to modify the voltage across the erase tunnel device via a feedback loop until the differential floating gate circuit settles to a steady state condition such that the floating gate voltage is approximately equal to the input set voltage. Thereafter, during a read mode, the differential floating gate circuit may be reconfigured to preferably function as a voltage comparator with a built-in voltage reference.

36 Claims, 8 Drawing Sheets

US 6,829,164 B2

DIFFERENTIAL FLOATING GATE CIRCUIT AND METHOD FOR PROGRAMMING

FIELD OF THE INVENTION

This invention relates to a method and circuit for an accurate voltage reference, and more specifically to a differential circuit that uses a feedback loop and dual conduction of tunnel devices to accurately program a desired charge level on a floating gate.

BACKGROUND OF THE INVENTION

Programmable analog floating gate circuits have been used since the early 1980's in applications that only require moderate absolute voltage accuracy over time, e.g., an absolute voltage accuracy of 100–200 mV over time. Such devices are conventionally used to provide long-term nonvolatile storage of charge on a floating gate. A floating gate is an island of conductive material that is electrically isolated from a substrate but capacitively coupled to the substrate or to other conductive layers. Typically, a floating gate forms the gate of an MOS transistor that is used to read the level of charge on the floating gate without causing any leakage of charge therefrom.

Various means are known in the art for introducing charge onto a floating gate and for removing the charge from the floating gate. Once the floating gate has been programmed at a particular charge level, it remains at that level essentially permanently, because the floating gate is surrounded by an insulating material which acts as a barrier to discharging of the floating gate. Charge is typically coupled to the floating gate using hot electron injection or electron tunneling. Charge is typically removed from the floating gate by exposure to radiation (UV light, x-rays), avalanched injection, or Fowler-Nordheim electron tunneling. The use of electrons emitted from a cold conductor was first described in an article entitled *Electron Emission in Intense Electric Fields* by R. H. Fowler and Dr. L. Nordheim, Royal Soc. Proc., A, Vol. 119 (1928). Use of this phenomenon in electron tunneling through an oxide layer is described in an article entitled *Fowler-Nordheim Tunneling into Thermally Grown SiO$_2$* by M. Lenzlinger and E. H. Snow, Journal of Applied Physics, Vol. 40, No. 1 (January, 1969), both of which are incorporated herein by reference. Such analog floating gate circuits have been used, for instance, in digital nonvolatile memory devices and in analog nonvolatile circuits including voltage reference, Vcc sense, and power-on reset circuits.

FIG. 1A is a schematic diagram that illustrates one embodiment of an analog nonvolatile floating gate circuit implemented using two polysilicon layers formed on a substrate and two electron tunneling regions. FIG. 1A illustrates a cross-sectional view of an exemplary prior art programmable voltage reference circuit 70 formed on a substrate 71. Reference circuit 70 comprises a Program electrode formed from a first polysilicon layer (poly1), an Erase electrode formed from a second polysilicon layer (poly2), and an electrically isolated floating gate comprised of a poly1 layer and a poly2 layer connected together at a corner contact 76. Typically, polysilicon layers 1 and 2 are separated from each other by a thick oxide dielectric, with the floating gate fg being completely surrounded by dielectric. The floating gate fg is also the gate of an NMOS transistor shown at 73, with a drain D and a source S that are heavily doped n+ regions in substrate 70, which is P type. (The number zero is also referred to as "0" or Ø herein.) The portion of dielectric between the poly1 Program electrode and the floating gate fg, as shown at 74, is a program tunnel region (or "tunnel device") TP, and the portion of dielectric between the poly1 floating gate fg and the poly2 erase electrode, shown at 75, is an erase tunnel region TE. Both tunnel regions have a given capacitance. Since these tunnel regions 74,75 are typically formed in thick oxide dielectric, they are generally referred to as "thick oxide tunneling devices" or "enhanced emission tunneling devices." Such thick oxide tunneling devices enable the floating gate to retain accurate analog voltages in the +/−4 volt range for many years. This relatively high analog voltage retention is made possible by the fact that the electric field in most of the thick dielectric in tunnel regions 74,75 remains very low, even when several volts are applied across the tunnel device. This low field and thick oxide provides a high barrier to charge loss until the field is high enough to cause Fowler-Nordheim tunneling to occur. Finally, reference circuit 70 includes a steering capacitor CC that is the capacitance between floating gate fg and a different n+ region formed in the substrate that is connected to a Cap electrode.

FIG. 1B is a schematic diagram that illustrates a second embodiment of a floating gate circuit 70 that is implemented using three polysilicon layers. The three polysilicon floating gate circuit 70' is similar to the two polysilicon embodiment except that, for example Erase electrode is formed from a third polysilicon layer (poly 3). In addition, the floating gate fg is formed entirely from a poly2 layer. Thus, in this embodiment there is no need for a corner contact to be formed between the poly1 layer portion and the poly2 layer portion of floating gate fg, which is required for the two polysilicon layer cell shown in FIG. 1A.

Referring to FIG. 2, shown at 25 is an equivalent circuit diagram for the voltage reference circuit 70 of FIG. 1A and 70' of FIG. 1B. For simplicity, each circuit element of FIG. 2 is identically labeled with its corresponding element in FIGS. 1A and 1B.

Setting reference circuit 70 to a specific voltage level is accomplished using two separate operations. Referring again to FIG. 1A, the floating gate fg is first programmed or "reset" to an off condition. The floating gate fg is then erased or "set" to a specific voltage level. Floating gate fg is reset by programming it to a net negative voltage, which turns off transistor TØ. This programming is done by holding the Program electrode low and ramping the n+ bottom plate of the relatively large steering capacitor CC to 15 to 20V via the Cap electrode. Steering capacitor CC couples the floating gate fg high, which causes electrons to tunnel through the thick oxide at 74 from the poly1 Program electrode to the floating gate fg. This results in a net negative charge on floating gate fg. When the bottom plate of steering capacitor CC is returned to ground, this couples floating gate fg negative, i.e., below ground, which turns off the NMOS transistor TØ.

To set reference circuit 70 to a specific voltage level, the n+ bottom plate of steering capacitor CC, the Cap electrode, is held at ground while the Erase electrode is ramped to a high voltage, i.e., 12 to 20V. Tunneling of electrons from floating gate fg to the poly2 Erase electrode through the thick oxide at 75 begins when the voltage across tunnel device TE reaches a certain voltage, which is typically approximately 11V. This tunneling of electrons from the fg through tunnel device TE increases the voltage of floating gate fg. The voltage on floating gate fg then "follows" the voltage ramp coupled to the poly2 Erase electrode, but at a voltage level offset by about 11V below the voltage on the Erase electrode. When the voltage on floating gate fg reaches the desired set level, the voltage ramp on poly2 Erase electrode is stopped and then pulled back down to ground. This leaves the voltage on floating gate fg set at approximately the desired voltage level.

As indicated above, reference circuit 70 meets the requirements for voltage reference applications where approximately 200 mV accuracy is sufficient. The accuracy of circuit 70 is limited for two reasons. First, the potential on floating gate fg shifts down about 100 mV to 200 mV after it is set due to the capacitance of erase tunnel device TE which couples floating gate fg down when the poly2 Erase electrode is pulled down from a high voltage to ØV. The amount of this change depends on the ratio of the capacitance of erase tunnel device TE to the rest of the capacitance of floating gate fg (mostly due to steering capacitor CC), as well as the magnitude of the change in voltage on the poly2 Erase electrode. This voltage "offset" is well defined and predictable, but always occurs in such prior art voltage reference circuits because the capacitance of erase tunnel device TE cannot be zero. Second, the accuracy of circuit 70 is also limited because the potential of floating gate fg changes another 100 mV to 200 mV over time after it is set due to various factors, including detrapping of the tunnel devices and dielectric relaxation of all the floating gate fg capacitors.

An analog voltage reference storage device that uses a floating gate is described in U.S. Pat. No. 5,166,562 and teaches the uses of hot electron injection for injecting electrons onto the floating gate and electron tunneling for removing electrons from the floating gate. The floating gate is programmed by controlling the current of the hot electron injected electrons after an erase step has set the floating gate to an initial voltage. See also U.S. Pat. No. 4,953,928. Although this method of programming the charge on a floating gate is more accurate than earlier analog voltage reference circuits including a floating gate, the level of accuracy is still on the order of 50 mV to 200 mV.

Prior art floating gate storage devices have sometimes used dual conduction of Fowler-Nordheim tunnel devices, i.e., wherein both the program and erase tunnel elements in a floating gate device are caused to conduct simultaneously in order to provide the coupling of charge onto the floating gate. However, this method has only been used in digital circuits to program the floating gate to either a "1" condition or a "0" condition to provide memory storage. The precise charge on the floating gate in such applications is not of concern and so is not precisely controlled in such circuits. According to the prior art, such dual conduction digital programming of a floating gate is considered to be a less efficient and desirable way than generating electron conduction through a single tunnel element to control the level of charge on a floating gate. Known disadvantages of dual conduction digital programming of a floating gate include the fact that a larger total voltage is required to provide dual conduction and tunnel oxide trap-up is faster because more tunnel current is required.

An example of a prior art analog nonvolatile floating gate circuit that uses dual conduction of electrons for adding and removing electrons from a floating gate is disclosed in U.S. Pat. No. 5,059,920, wherein the floating gate provides an adaptable offset voltage input for a CMOS amplifier. In this device, however, only one Fowler-Nordheim tunnel device is used. The electrons are injected onto the floating gate using hot electron injection, while Fowler-Nordheim electron tunneling is used to remove electrons from the floating gate, so as to accurately control the charge on the floating gate. This means of injecting electrons onto the floating gate is used because the charge transfer is a controlled function of the voltage on the floating gate. Another example of a prior art dual conduction floating gate circuit is disclosed in U.S. Pat. No. 5,986,927. A key problem with such prior art devices is that they do not compensate for common-mode voltage and current offsets, common-mode temperature effects, and mechanical and thermal stress effects in the integrated circuit.

Applications that require increased absolute voltage accuracy generally use a bandgap voltage reference. A bandgap voltage reference typically provides approximately 25 mV absolute accuracy over time and temperature, but can be configured, to provide increased accuracy by laser trimming or $E^2$ digital trimming at test. While a bandgap voltage reference provides greater accuracy and increased stability over the prior art voltage reference circuits discussed above, a bandgap voltage reference only provides a fixed voltage of about 1.2V. Therefore, additional circuitry, such as an amplifier with fixed gain, is needed to provide other reference voltage levels. Moreover, prior art bandgap voltage references typically draw a relatively significant current, i.e., greater than 10 $\mu$A.

What is needed is an analog programmable voltage reference circuit that can be quickly and accurately set to any analog voltage without the need for a fixed-gain amplifier and that provides improved stability and accuracy over time and temperature as compared to prior art voltage references. It is also desirable that the improved stability and accuracy be obtained in a voltage reference circuit that draws significantly less current than prior art voltage references.

SUMMARY OF THE INVENTION

The present invention is directed at addressing the above-mentioned shortcomings, disadvantages, and problems of the prior art. The present invention comprises a floating gate circuit including a floating gate having a voltage thereon, a first tunnel device formed between said floating gate and a first tunnel electrode, and a second tunnel device formed between said floating gate and a second tunnel electrode for causing electrons to tunnel onto and off of said floating gate for modifying the voltage on said floating gate as a function of a voltage differential between said first and second tunnel electrodes, a first circuit coupled to said floating gate for causing the voltage on said floating gate to be compared to a first voltage, and a feedback circuit coupled between said floating gate and said first circuit for controlling said voltage differential such that the voltage on said floating gate is modified until said floating gate circuit reaches a steady state condition wherein the voltage on said floating gate is a predetermined function of said first voltage.

The present invention also comprises a differential floating gate circuit, comprising: a) a floating gate; b) a first circuit coupled to said floating gate, said first circuit comprising a first tunnel device formed between said floating gate and a first tunnel electrode and a second tunnel device formed between said floating gate and a second tunnel electrode; c) a second circuit operatively coupled to said floating gate and an input voltage terminal and having an output terminal; and d) a feedback loop coupled between said output terminal and said first tunnel electrode, wherein during a set mode: said first circuit for causing said first and second tunnel devices to operate in a dual conduction mode, under the control of a voltage differential between the first and second tunnel electrodes, for modifying the charge level on said floating gate; said second circuit for comparing the voltage on said floating gate with an input set voltage at said input voltage terminal and generating an output voltage at said output terminal that is a function of the difference between said floating gate voltage and said input set voltage; said feedback loop for causing the voltage at said first tunnel electrode to be modified as a function of the output voltage, until said differential floating gate circuit reaches a steady state condition such that said floating gate voltage is approximately equal to the input set voltage. According to the present invention, the differential floating gate circuit can then be configured in a read mode to preferably operate as a voltage comparator with a built-in voltage reference or can be configured as a voltage reference circuit for generating an output reference voltage that is a function of the input set voltage.

The present invention is also a method for programming a differential floating gate circuit. According to the present invention, in a floating gate circuit including a floating gate having a voltage thereon, a first tunnel device formed between said floating gate and a first tunnel electrode, and a second tunnel device formed between said floating gate and a second tunnel electrode for causing electrons to tunnel onto and off of said floating gate for modifying the voltage on said floating gate as a function of a voltage differential between said first and second tunnel electrodes, a method of setting the voltage on said floating gate comprises the steps of causing the voltage on said floating gate to be compared to a first voltage, and causing the voltage on said floating gate to be modified using a feedback circuit until said floating gate circuit reaches a steady state condition such that the voltage on said floating gate is a predetermined function of said first voltage.

Alternatively, the method according to the present invention for programming a floating gate in a differential floating gate circuit to an input set voltage comprises the steps of: a) causing a first and second tunnel device coupled to said floating gate to operate in a dual conduction mode under the control of a voltage differential between a first tunnel electrode coupled to said first tunnel device and a second tunnel electrode coupled to said second tunnel device, for modifying the charge level on said floating gate; b) comparing the voltage on said floating gate with an input set voltage at an input voltage terminal and generating an output voltage at an output voltage terminal that is a function of the difference between said floating gate voltage and said input set voltage; and c) causing the voltage at said first tunnel electrode to be modified as a function of the output voltage via a feedback loop coupled between said output voltage and said first tunnel electrode and repeating steps (a) and (b) if said differential floating gate circuit has not reached a steady state condition such that said floating gate voltage is approximately equal to said input set voltage. According to the present invention, the method for programming may also include the step of causing the voltage at said first tunnel electrode and the voltage at said second tunnel electrode to ramp toward a predetermined voltage such that said first and second tunnel devices are no longer in dual conduction. Preferably, the voltages at said first and second tunnel electrodes are ramped toward ground at the same rate.

An object of the present invention is to provide a method and circuit for generating a voltage reference that has an improved accuracy and stability over the prior art voltage references.

A key advantage of the present invention is the improved initial setting accuracy over prior art floating gate voltage references by more than a factor of 100.

Another key advantage of the present invention is that, without the need for using laser trimming or $E^2$ digital trimming, the present invention has an improved accuracy over bandgap voltage references of a factor of 10 to 50 while drawing less power by a factor of more than 10. Moreover, a voltage reference of greater than or less than 1.2 volts can be set using the present invention without the need for additional amplifiers.

Another advantage of the present invention is that, after a high voltage set mode, the invention allows for a controlled ramp down sequence to ramp down the voltages at the floating gate erase and program electrode such that, when voltage and current sources are completely shut down in the circuit a more accurate voltage is set on the floating gate.

Another advantage of the present invention is that the voltage at the erase electrode is controlled during the ramp down sequence by shutting off the negative charge pump while allowing the feedback circuit to remain active.

Another advantage of the present invention is that tunnel current is used to self-discharge the voltage at each program electrode.

Another advantage of the present invention is the use of a capacitor to control the ramp down rate after shutting off the negative charge pump.

Another advantage of the present invention is that feedback response time tracks tunnel current through the erase and program tunnel devices such that the ramp down rates of the voltages at each erase electrode and program electrode are essentially the same.

Another advantage of the present invention is that the feedback response time is kept slower than the ramp rate so the voltage at the erase electrode never goes below the voltage on the second floating gate in order to avoid oscillation.

Another advantage of the present invention is that the accuracy of setting the floating gate improves as the ramp down time increases.

BRIEF DESCRIPTION OF THE DRAWINGS

The forgoing aspects and attendant advantages of the present invention will become more readily appreciated by reference to the following detailed description, when taken in conjunction with the accompanying drawings, wherein.

DETAILED DESCRIPTION OF THE INVENTION

Figure 1A:
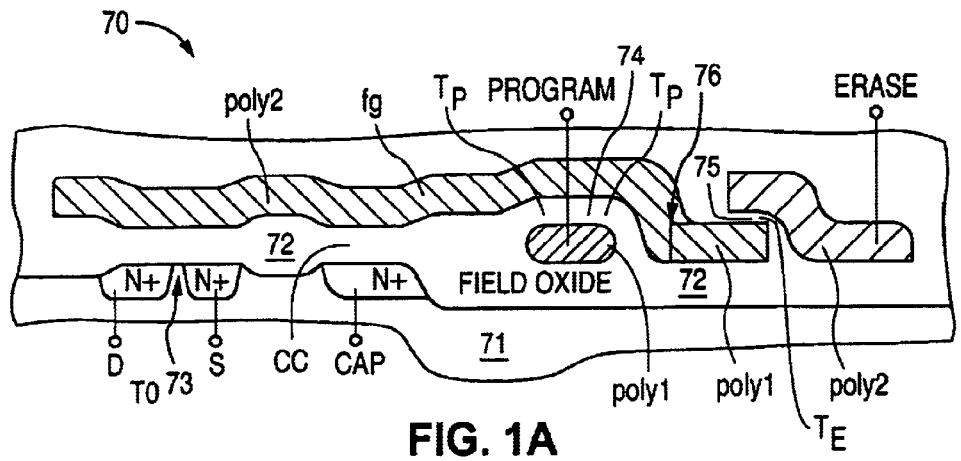
FIG. 1A is a schematic diagram that illustrates a cross-sectional view of a prior art programmable floating gate circuit formed from two polysilicon layers.
Figure 1B:
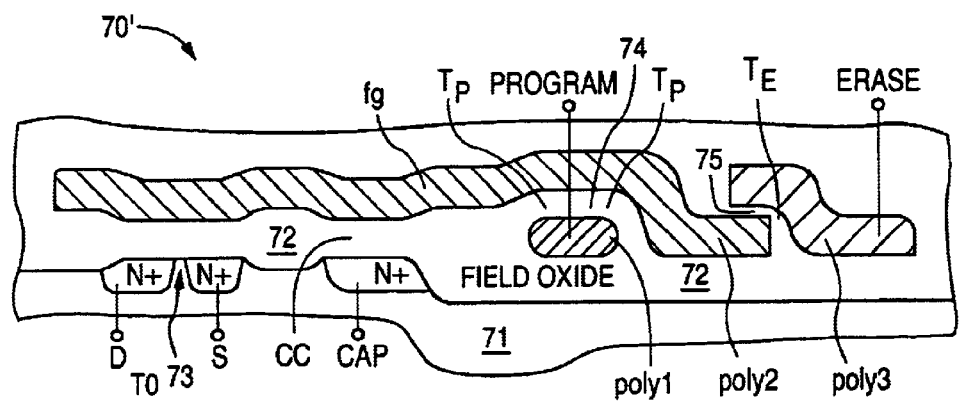
FIG. 1B is a similar prior art floating gate circuit formed from three polysilicon layers.
Figure 2:
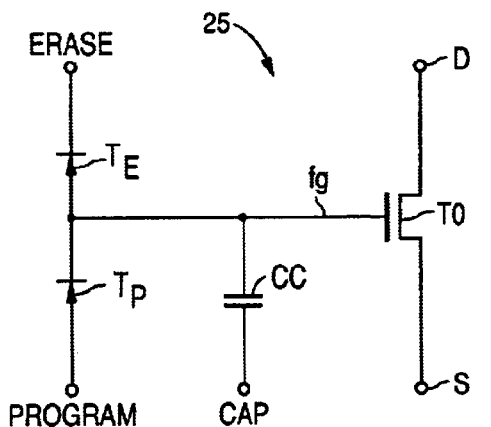
FIG. 2 is an equivalent circuit diagram for the reference circuit illustrated in FIGS. 1A and 1B.
Figure 3:
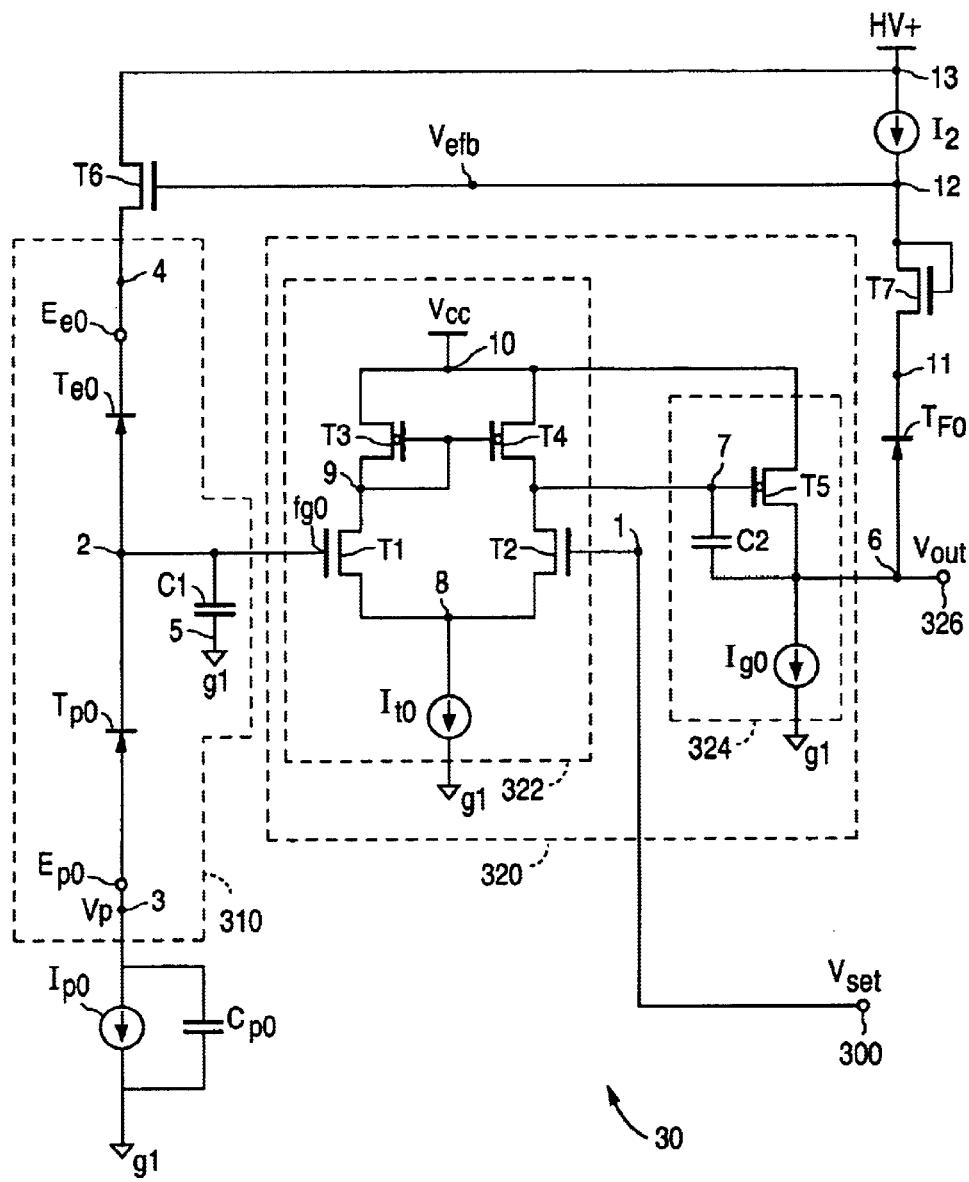
FIG. 3 is a circuit diagram of a differential single floating gate circuit according to one embodiment of the present invention.

FIG. 3 is a circuit diagram of a differential floating gate circuit 30 according to one embodiment of the present invention. Circuit 30 can be used to accurately set a floating gate to an analog voltage during a high voltage set mode or set cycle. Once the voltage level is set, circuit 30 can then preferably be configured during a read mode as a voltage comparator circuit with a built-in voltage reference. Circuit 30 may also be configured in the read mode as a voltage reference circuit. Circuit 30 is preferably implemented as an integrated circuit manufactured using industry standard CMOS processing techniques.

Circuit 30 comprises a floating gate fgØ at a node 2 that, at the conclusion of a set mode, is set to a voltage that is a function of, and preferably is equal to an input set voltage Vset received at an input terminal 300 coupled to a node 1. This set mode may be instituted at the factory to cause floating gate fgØ to be set to a desired voltage. Alternatively, a later user of circuit 30 can cause circuit 30 to enter a set mode wherever the user wishes to update the voltage on fgØ as a function of the Vset voltage input by the user during this later, or in the field, set mode operation. Circuit 30 further comprises a circuit 310 that includes: a programming tunnel device TpØ formed between floating gate fgØ and a programming electrode EpØ, at a node 3; an erase tunnel device TeØ formed between floating gate fgØ and an erase electrode EeØ, at a node 4; and a steering capacitor C1 coupled between floating gate fgØ and a node 5.

Preferably, programming electrode EpØ receives a negative voltage during the set mode, and erase electrode EeØ receives a positive voltage during the set mode. Moreover, TpØ and TeØ are preferably Fowler-Nordheim tunnel devices that are reasonably well matched by layout. The bottom plate of steering capacitor C1 is coupled to a predetermined voltage during the set mode that is preferably ground g1. Steering capacitor C1 is used to provide a stable ground reference for floating gate fgØ.

Setting a fgØ to a specific charge level during the set mode, which corresponds to a specific voltage at node 2, is achieved by taking EpØ negative and EeØ positive such that the voltage at node 4 minus the voltage at node 3 is two tunnel voltages or approximately 22V. An alternative is to take EpØ negative and EeØ positive such that approximately 2 nA of current flows from node 4 to node 3. In either case, both tunnel devices are conduction, i.e., the tunnel devices are in "dual conduction." By operating in dual conduction, the voltage on the floating gate fgØ can stabilize at a DC voltage level for as long a time as needed for Circuit 30 to settle to a very precise and accurate level. Operating in dual conduction is key to making it possible to set the floating gate fgØ voltage very accurately using either on-chip circuitry or test equipment off-chip.

In dual conduction, the tunnel devices TeØ and TpØ, which are reasonably well matched as a result of their chip layout, will modify the charge level on the floating gate fgØ by allowing electrons to tunnel onto and off of floating gate fgØ so as to divide the voltage between nodes 4 and 3 in half. Thus, the floating gate voltage, i.e., the voltage at node 2, will be VfgØ=Vnode3+(Vnode4−Vnode3)/2, which is half way between the voltage at node 4 and the voltage at node 3. Under these conditions, the dual conduction current can typically charge or discharge node 2, which typically has less than 1.0 pF capacitance, in less than 1 mSec. As this occurs, the floating gate voltage "tracks" directly with the voltage at nodes 3 and 4 and settles to a DC voltage that is half way between those two voltages in a few mSec. Accordingly, VfgØ can be set to a positive or a negative voltage or zero volts depending upon the voltages received at electrodes EeØ and EpØ. For example, if the tunnel voltage is approximately 11V for the erase and program tunnel devices TeØ and TpØ, and the voltage at electrode EeØ is set to about +16V and the voltage at electrode EpØ is set to about −6V, then VfgØ will settle at about +5V, which is the midpoint between the two voltages. If the voltage at electrode EeØ is set to about +11V and the voltage at electrode EpØ is set to about −11 V, then VfgØ will go to about ØV. If the voltage at electrode EeØ is set to about +6V and the voltage at electrode EpØ is set to about −16V, then VfgØ will go to about −5V.

Circuit 30 further includes a circuit 320 that compares VfgØ, the voltage on the floating gate fgØ, with the voltage at node 1 and generates an output voltage Vout, at a node 6, that is a function of the difference between VfgØ and the voltage at node 1. Circuit 320 preferably includes a differential amplifier (or differential stage) 322 that is preferably configured to have an inverting input coupled to floating gate fgØ, a non-inverting input coupled to node 1, and an output at a node 7. Circuit 320 preferably further includes a gain stage 324 with an input coupled to node 7 and an output terminal 326, at node 6. The differential stage compares the voltages received at its inputs and amplifies that difference, typically by a factor of 50 to 100. The gain stage then further amplifies that difference by another factor of 50 to 100. Moreover at the conclusion of the set mode, circuit 320 ideally settles to a steady state condition such that VfgØ= Vset.

Referring again to FIG. 3, the differential stage 322 preferably includes enhancement mode transistors T1, T2, T3 and T4. Transistors T1 and T2 are preferably NMOS transistors that are reasonably well matched by layout, and transistors T3 and T4 are preferably PMOS transistors that are reasonably well matched by layout. The sources of NMOS transistors T1 and T2 are coupled together at a node 8. The drain of NMOS transistor T1 is coupled to a node 9, and its gate is floating gate fgØ. The drain of NMOS transistor T2 is coupled to node 7, and its gate is coupled to node 1. PMOS transistor T3 is coupled common drain, common gate, to node 9, with its source coupled to a node 10. The gate of PMOS transistor T4 is coupled to node 9. Its drain is coupled to node 7, and its source is coupled to node 10. A voltage supply Vcc, typically 3 to 5 volts, is coupled to node 10, and a current source ItØ is coupled between node 8 and ground g1 to cause transistors T1, T2, T3 and T4 to operate in either the prethreshold or linear region during the set mode. Current source ItØ can be implemented using any number of conventional circuits.

One benefit provided by differential stage 322 is that temperature and stress effects track in transistors T1–T4 because the temperature coefficient Tc of these transistors is approximately the same. That is, any variation in the temperature of the integrated circuit chip on which a floating gate circuit according to the present invention is implemented will have the same effect on transistors T1–T4, such that differential stage 322 is in a balanced condition essentially independent of temperature. Similarly, mechanical and thermal stress effects are also common-mode and so their effects are also greatly reduced.

The gain stage 324 preferably includes a PMOS pull-up transistor T5 biased by Vcc, and includes a current source pull-down load IgØ. The source of transistor T5 is coupled to node 10. Its drain is coupled to the differential stage PMOS pull-up T4 at node 7, and its source is coupled to node 6. Current source pull-down load IgØ is coupled between node 6 and ground g1. The gain stage 324 also preferably includes a compensation capacitor C2 coupled between nodes 6 and 7. Current source pull-down load IgØ is preferably an active load using an NMOS current mirror or a depletion device. Using an active current source with relatively high output resistance, the gain stage 814 can provide a voltage gain of about 100. The output swing of the gain stage 324 is nearly full rail from ground to Vcc. Stability and response of this circuit can be easily adjusted for various processes using compensation capacitor C2. In this configuration, transistor T5 provides good current sourcing capability, but current sinking is limited to the current in the current source pull-down IgØ. Therefore, the current in IgØ should be greater than the pull-up current required by the load on Vout so that the gain stage 324 is capable of adequately controlling Vout, at node 6, by sinking all of the current that flows to node 6.

Circuit 320 further operates in the following manner during the set mode. When biased by Vcc and current source ItØ, T1 senses VfgØ relative to Vset, which is sensed by transistor T2, and the amplified difference appears as Vout at node 6. If VfgØ is initially less than Vset, T2 is turned on more than T1, and the current flow through T2 (and through T4 since they are connected in series) is initially greater than the current flow through T1 (and correspondingly T3). The gate of the pullup transistor T3 is tied to the drain of T3 and also to the gate of pullup transistor T4, which makes the current in T4 a mirror of the current in T3. When more current flows through T4 than T3, the voltage, V7, on node 7 drops below the voltage, V9, on node 9. The lower voltage on node 7 causes the current through T5 to increase which pulls Vout high. The voltage gain of the differential stage 322 is typically about 80 and the voltage gain of the output stage 324 is about 100, giving an overall gain from Vset to Vout of about 8000. A negative feedback path or loop from Vout to the inverting input fgØ is necessary for the differential circuit 320 to settle at the point where the voltage on fgØ is equal to Vset. During the set mode, this feedback path is provided by tunnel devices TFØ, TeØ and transistors T6 and T7 as described in the next section. When Vout goes high, the negative feedback path pulls VfgØ higher. As VfgØ rises, the current in T1 increases until it matches the current in T2. At this point, the differential circuit 320 settles to a steady state condition where the currents in transistors T1, T2, T3 and T4 match, and VfgØ=Vset.

Those skilled in the art will realize that circuit 320 can be implemented using PMOS transistors for T1 and T2 and NMOS transistors for T3 and T4. For this implementation, the gain stage 324 comprises an NMOS pull-down transistor T5 coupled to a current source pull-up load IgØ.

Circuit 30 also includes a feedback loop coupled between nodes 6 and 2. During the set mode, this feedback loop causes the voltage differential between tunnel electrodes EeØ and EpØ to be modified by modifying the voltage at node 4 as a function of the output voltage at node 6. The feedback loop preferably comprises a level shift circuit that is preferably a tunnel device TFØ formed between node 6 and a node 11 and a transistor T7, preferably an NMOS transistor, coupled common gate, common drain to a node 12, with its source coupled to node 11. Also included in the feedback loop is a transistor T6, preferably an NMOS transistor, having its gate coupled to node 12, its source coupled to node 4, and thereby to erase tunnel device TeØ, and its drain coupled to a node 13.

As earlier indicated, the maximum output of the gain stage is approximately Vcc. However, this is not high enough to drive Vefb at node 12 directly, because Vefb typically needs to go to about 14 to 19 volts, which is well above the usual 3 to 5 volt Vcc supply level. The level shift circuit TFØ and T7 shifts the relatively low output voltage at node 6 (Vout) up to the desired 14 to 19 volt range. Preferably, TFØ and TeØ are reasonably well matched by layout and transistors T6 and T7 are reasonably well matched by layout. Under these conditions, when the same tunnel current flows through both TFØ and TeØ, the level shift tracks the erase tunnel voltage as measured by the voltage drop from node 4 to node 2, which drives the gate of transistor T1 (fgØ) to the same voltage as the voltage on the gate of transistor T2 (Vset) when circuit 320 settles. This adds to the improved setting accuracy of the circuit.

One advantage of having the level shift track the erase tunnel voltage is that, as the voltage necessary to create tunneling changes, due to charge trapping in the dielectric as more and more set cycles are performed, output voltage Vout continues to follow the input set voltage Vset and operate in the same voltage range. Another advantage is that when the output voltage Vout is not quite equal to the input set voltage Vset, the error introduced by the finite gain of circuit 320 is very small. For example, if circuit 320 has a gain of 10,000 and Vout is 1 volt lower than Vset and VfgØ when circuit 30 settles, VfgØ will have an error of 1V/10,000, or only 0.1 mV.

Circuit 30 also preferably includes current sources I2 and IpØ, and a capacitor CpØ. Current source I2 is coupled between node 12 and a high voltage supply HV+ at node 13 for establishing Vefb at the beginning of the set mode and for providing tunnel current through TFØ. Current source I2 can be implemented using any number of conventional methods. However, current source I2 is preferably a current regulator that is biased by HV+, such as a current mirror comprising P-Channel devices that operate in the prethreshold region. In this manner, current source I2 will automatically go to whatever positive voltage needed at node 12 to establish the tunnel current through tunnel device TFØ. Current source I2 preferably generates a current that is about the same as IpØ. This means the current through tunnel device TFØ is about the same as the current through tunnel devices TeØ and TpØ.

Current source IpØ is coupled between node 3 and ground g1. Current source IpØ is preferably a P-Channel charge pump that is used as a negative current source to pump a controlled tunnel current out of programming tunnel device TpØ. Since IpØ is a current source, it automatically goes to whatever negative voltage at node 3 that is needed to establish the tunnel current at the desired level, assuming the current source has sufficient voltage compliance. Moreover, once the current through the tunnel devices is established, the voltage across the tunnel devices is also well defined by their Fowler-Nordheim characteristics. Therefore, current source IpØ products Vp, the voltage at node 3, by controlling the current through tunnel device TpØ. Using a current source IpØ is the preferred way to assure that tunnel devices TeØ and TpØ are operating at a current level that is high enough to allow dual conduction and to allow the feedback circuit to work, but low enough to avoid excessive current flow which damages the tunnel devices. Capacitor CpØ, controls the discharge of current through the tunnel devices when, as explained in more detail below, IpØ is shut down at the conclusion of the set mode.

Those skilled in the art will realize that Vp can also be produced using a fixed voltage supply that is about 24 to 30 volts below Vefb. However, this topology should be used with caution because the current in Fowler-Nordheim tunnel devices varies exponentially with the applied voltage. In particular, very high current will flow through the tunnel devices if the voltage differential is too high, and extremely low current may flow if the voltage differential is too low. Very high currents will damage or "wear out" the tunnel devices due to rapid charge trapping in the dielectric, and if the tunnel current is too low, the feedback circuit will not be able to tunnel charge onto or off of fgØ, and thus will not be able to control the voltage on fgØ. Moreover, it is also possible to connect Vefb to a current source and connect Vp to the feedback circuit such that Vp controls the voltage on fgØ. However, this would require the feedback circuit to produce a controlled negative voltage, which is more difficult to integrate in a standard CMOS process.

Figure 4:
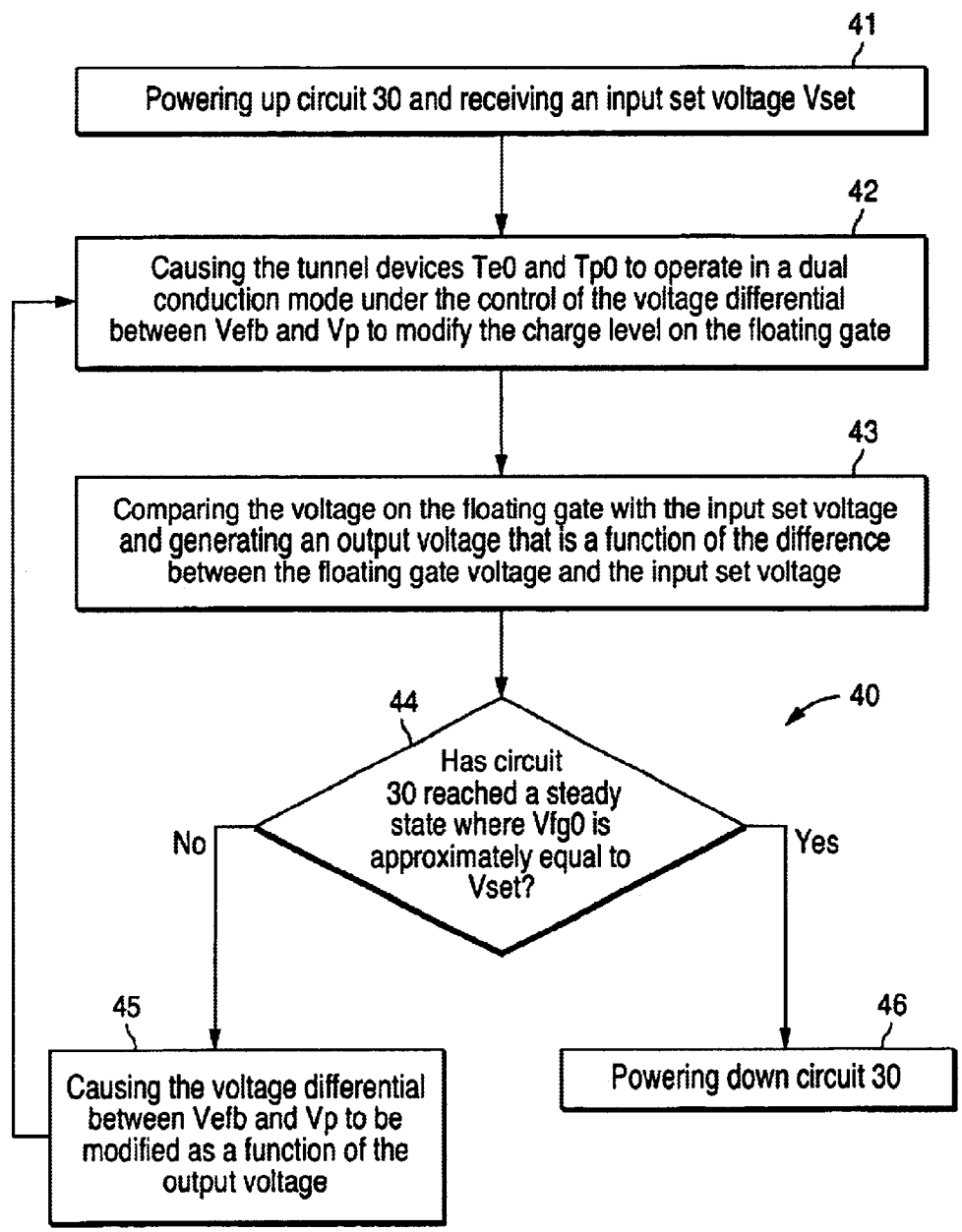
FIG. 4 is a flow diagram illustrating a method for setting a floating gate according to the present invention.
Figure 5:
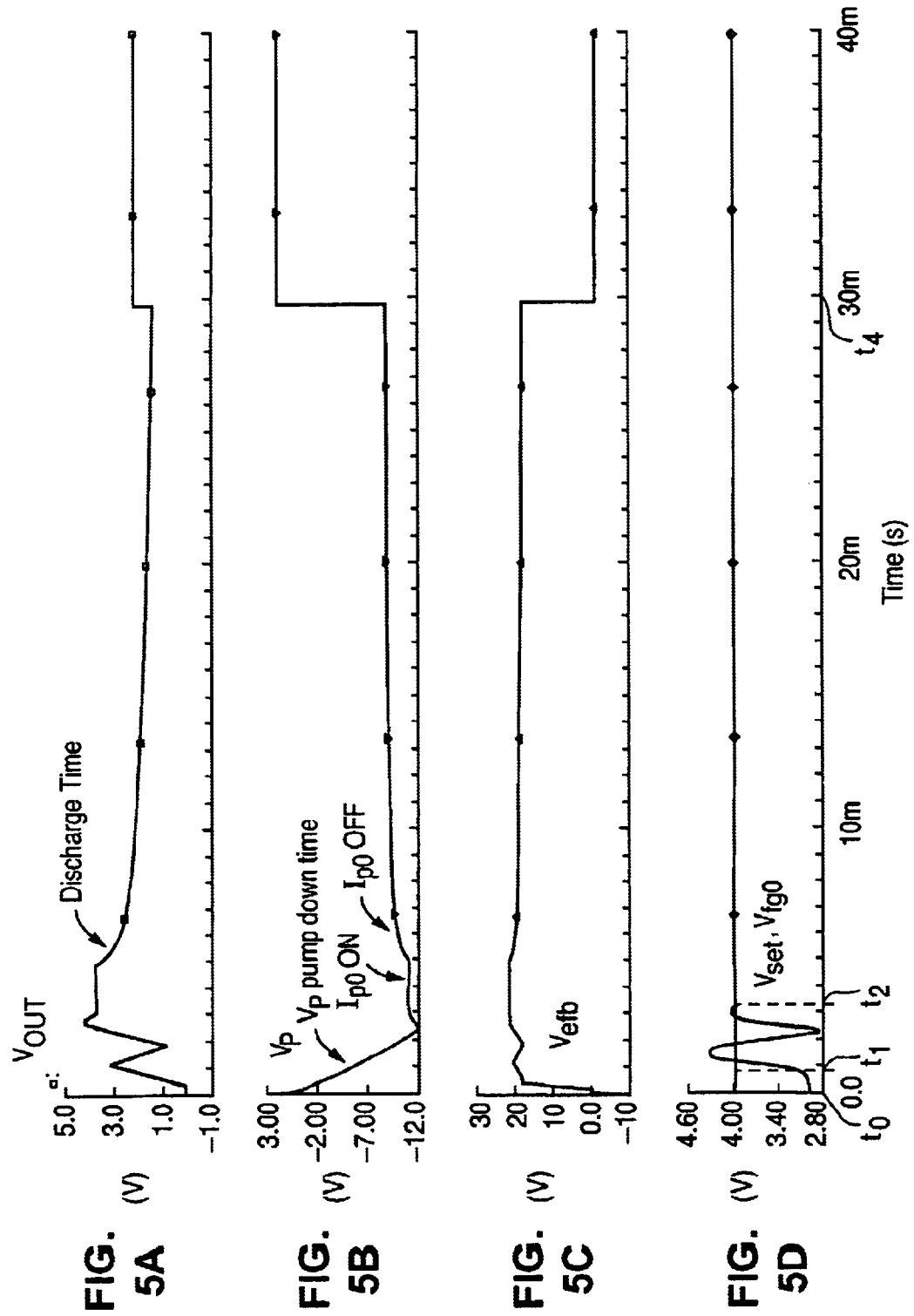
FIGS. 5A–5D illustrates various voltage waveforms vs. time for a specific implementation of the method of FIG. 4.
Figure 6:
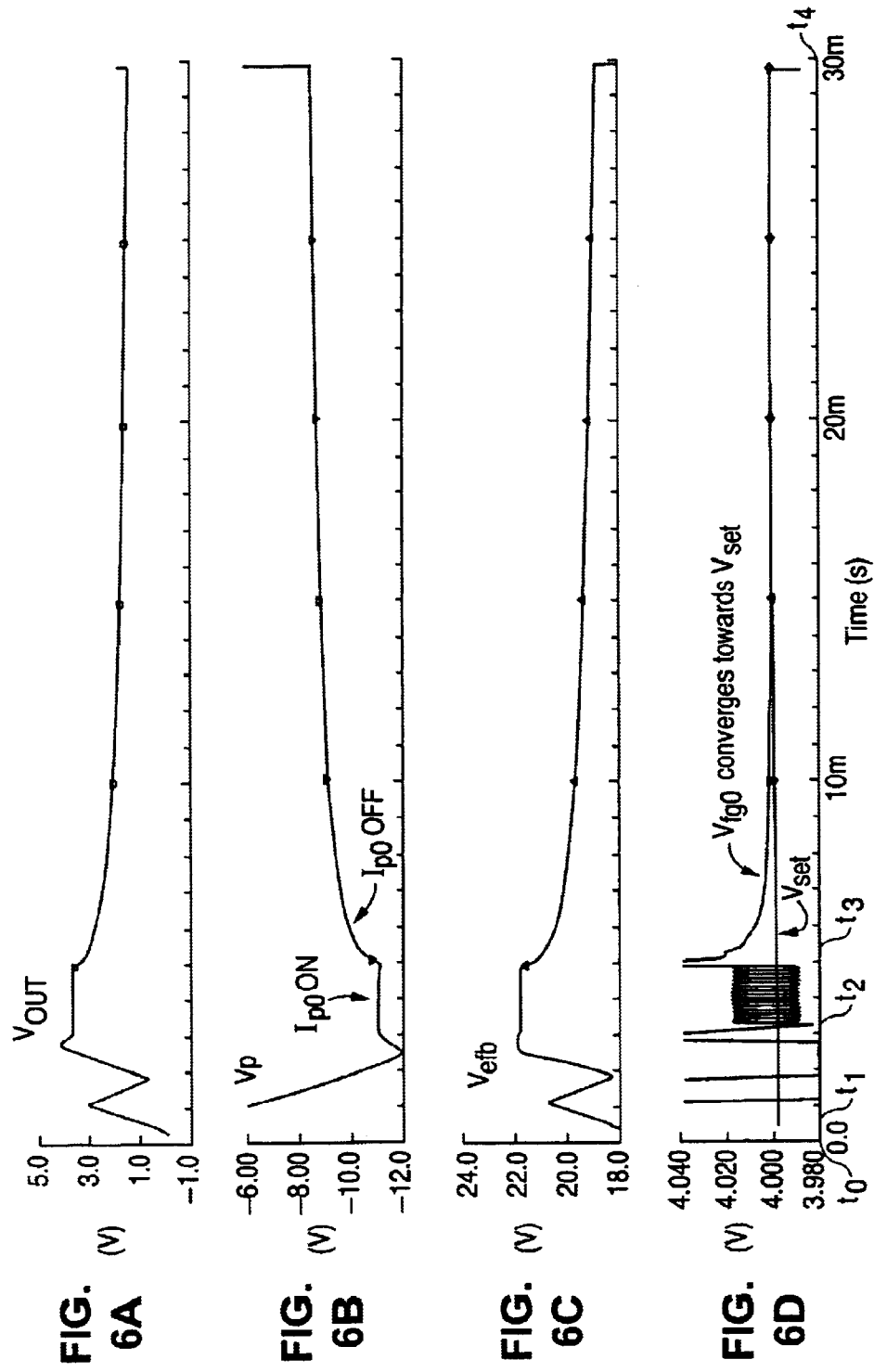
FIGS. 6A–6D illustrate various voltage waveforms vs. time for a specific implementation of the method of FIG. 4.

FIG. 4 is a flow diagram illustrating a method 40 for setting a floating gate that may be implemented during a set mode, for instance, by circuit 30 of FIG. 3. FIGS. 5A–7D illustrate voltage waveforms for Vout, Vp, Vefb, VfgØ and Vset, for the specific implementation of method 40 discussed below relative to those figures. Each of the four waveforms shown in FIGS. 5A–7D are the same, only the voltage axes of some of these waveforms are modified to illustrate specific details. In the circuit implementation illustrated in FIGS. 5A–7D Vset=4.00V; Vcc=+5V, HV+ is about 22V, IpØ is about 6 nA, I2 is about 6 nA, ItØ is about 5 nA; and IgØ is about 20 nA.

Figure 7:
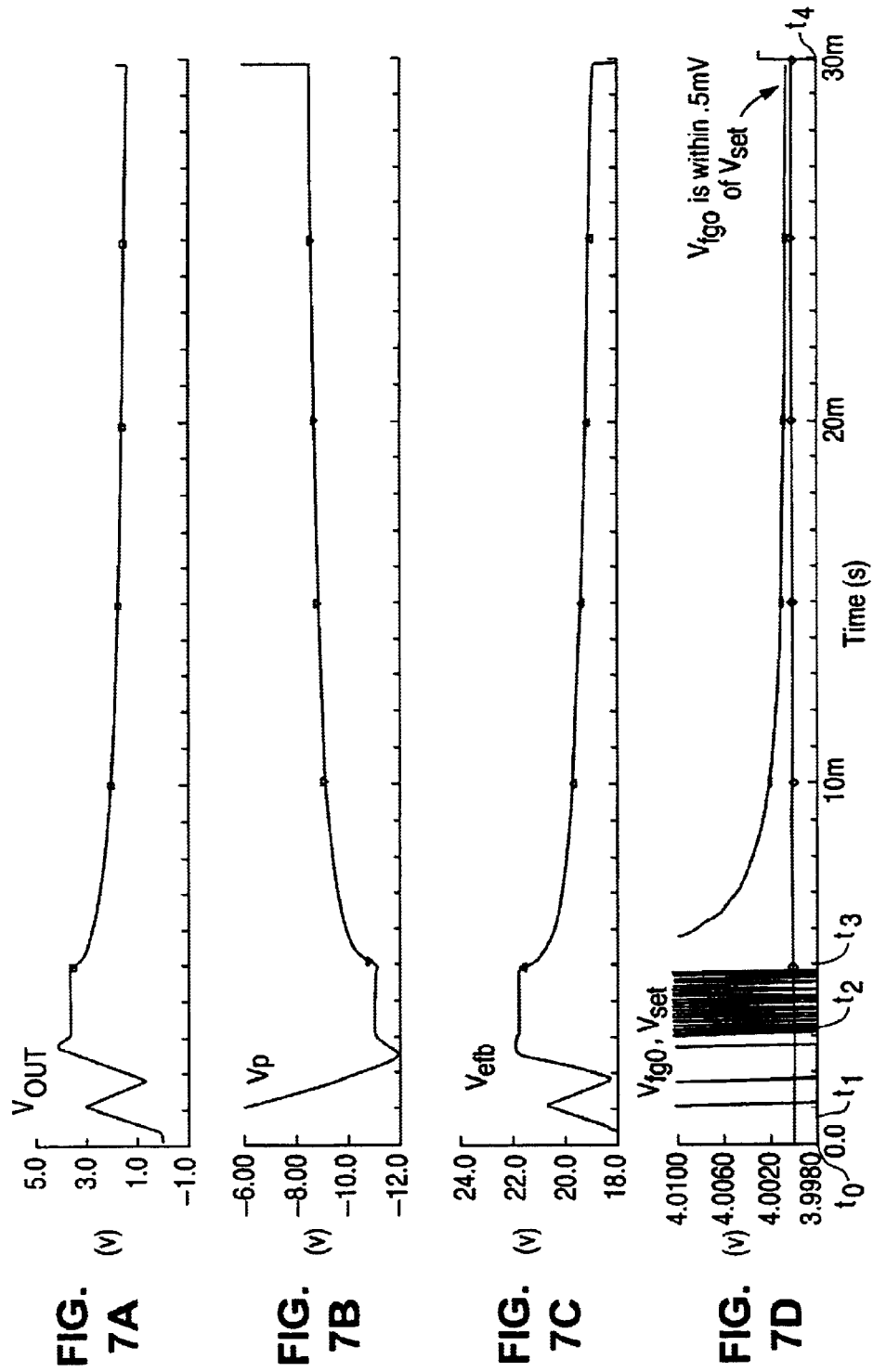
FIGS. 7A–7D illustrate various voltage waveforms vs. time for a specific implementation of the method of FIG. 4.

At step 41, circuit 30 is powered up at the beginning of the set mode, which is illustrated in FIGS. 5A–7D as time $t_0$, and at some point thereafter receives input set voltage Vset. FIGS. 5D, 6D, and 7D further illustrate Vset being held at a constant voltage of 4.00V. In addition Vcc is set to +5V, HV+ is ramped up to a high positive voltage of about +22V, which turns on I2, and current source IpØ is turned on to enable this current source to begin generating its corresponding current. Thereafter, according to the preferred implementation of the remaining steps 42–46 of method 40, circuit 30 can set VfgØ to within about 0.5 mV of Vset in about 30 mSec, as illustrated in FIGS. 5D, 6D, and 7D.

At step 42, circuit 30 causes tunnel devices TeØ and TpØ to operate in a dual conduction mode under the control of the voltage differential between the erase and programming electrodes EeØ and EpØ, respectively, for modifying the charge level on floating gate fgØ. Dual conduction occurs when tunnel current flows through both TeØ and TpØ. Tunnel current flows through TeØ and TpØ when the voltage differential between the erase and programming electrodes is at least two tunnel voltages or approximately 22V as discussed earlier.

Preferably, circuit 30 causes dual conduction in the following manner. Current source I2 pulls node 12, Vefb, up relatively quickly to about +18V. Vefb (node 12) turns on transistor T6, which pulls VeØ (node 4) to one Vt below Vefb. Charge pump IpØ gradually charges capacitor CpØ and ramps Vp (node 3) down to a negative voltage of about −11V in about 2 mSec. Once Vp ramps down to the point where the difference between VeØ and Vp is at least two tunnel voltages, tunnel current flows through both tunnel devices TeØ and TpØ, under the control of IpØ, and VfgØ is controlled directly by Vefb. I2 continues to pull up Vefb until Vefb reaches Vout+1TV+1Vt, where 1TV is the tunnel voltage across tunnel device TFØ, and 1Vt is the threshold voltage of transistor T7. When at least one tunnel voltage exists across TFØ tunnel current flows through TFØ, and TFØ and T7 act as level shift devices such that Vefb is controlled directly by Vout. At step 43, circuit 30 compares VfgØ with Vset and generates an output voltage Vout that is a function of the difference between VfgØ and Vset. Circuit 30 then, at step 45, causes the voltage differential between Vefb and Vp to be modified as a function of Vout, by modifying Vefb, and circuit 30 repeats steps 42 through 45 until circuit 30 settles to a steady state condition, at step 44, where VfgØ is approximately equal to Vset. At this point circuit 30 is powered down, at step 46. As a result of method 40, fgØ is set to a charge level that will remain essentially the same over time.

The voltage waveforms of FIGS. 5A–7D illustrate how circuit 30 functions during steps 42 through 45. Dual conduction occurs after about 0.5 mScc, which is illustrated as time $t_1$ in FIGS. 5A–7D. Prior to time $t_1$ Vout=0V, Vefb is pulled up by I2, and VfgØ is not controlled by Vefb. However, once tunnel current is flowing through TeØ, TpØ and TFØ at time $t_1$: the differential stage senses that VfgØ is not equal to Vset; Vout is a function of the difference between VfgØ and Vset; Vefb follows Vout; and VfgØ follows Vefb. For about the next 2.5 mSec, which is illustrated as time $t_1$ to time $t_2$ in FIGS. 5A–7D, VfgØ oscillates above and below Vset as Vefb moves up and down as a function of the negative feedback loop.

At the beginning of this oscillation period at time $t_1$, it can be seen in FIG. 5D that VfgØ is below Vset. Thus, transistor T1 is OFF and transistor T2 is ON, which pulls down node 7. This turns on transistor T5, which quickly pulls up Vout from zero volts, also illustrated in FIG. 5A. Since tunnel current is flowing through TFØ, TFØ and T7 act as level shifters such that Vefb pulls up 1TV and 1Vt above Vout. Vefb then pulls up VfgØ through tunnel device TeØ. Since Vp is continuing to ramp down to a predetermined negative voltage, VfgØ is pulled greater than Vset after about 1 mSec. At that point, the differential stage 322 senses that VfgØ is greater than Vset, and the gain stage 324 amplifies that difference, quickly pulling Vout low, which pulls Vefb low and pulls VfgØ back down low. When VfgØ is approximately equal to Vset, circuit 320 ceases to oscillate except for some noise coupled to circuit 320 from the charge pump IpØ, as best shown in FIGS. 6A–7D beginning at time $t_2$.

Beginning at time $t_1$, current source IgØ in the gain stage 324 produces a current that is much larger than that generated by current source I2. Therefore, the gain stage 324 is able control Vout by sinking all the current from I2 that flows through T7 and TFØ to Vout. In addition, the compensation capacitor C2 in the gain stage 324 is made large enough to assure the feedback loop is stable and settles in less than about 1 mSec. The level shift in Vefb caused by the Vt across T7 approximately matches the voltage drop in T6. The level shift in Vefb caused by the tunnel voltage across TFØ approximately matches the voltage drop across tunnel device TeØ, so that when the differential and gain stages settle, VfgØ and Vout are about the same. This can be seen in FIGS. 7A and 7D where Vout settles to within about 30 mV of VfgØ, beginning at time $t_2$. This 30 mV difference is generated by noise coupled to fgØ from the IpØ current source. Specifically, negative charge pump IpØ, which pumps charge from the program tunnel device TpØ, produces noise on Vp. This noise is coupled to floating gate fgØ through program tunnel device capacitance CpØ. The noise on Vp cannot be seen in the Vp waveform in FIG. 7B because the voltage axis is shown in volts, whereas the voltage axis for the VfgØ vs. Vset waveform is shown in millivolts.

Referring again to FIG. 4, once circuit 30 settles at step 44 such that VfgØ is approximately Vset, circuit 30 is powered down at step 46. Powering down circuit 30 ramps Vefb and Vp toward ground as seen beginning at $t_3$ in FIGS. 6A–7D.

Step 46 may be performed by simply concurrently shutting off the charge pump IpØ and HV+, and thereby current source I2, at time t₃. However, this may significantly impact VfgØ once Vefb and Vp have ramped back to ØV. As explained above, noise from IpØ limits the accuracy of setting VfgØ equal to Vset when the negative charge pump that generates Vp is ON. This means VfgØ may not be equal to Vset at the beginning of the ramping of Vefb and Vp to ground. If VfgØ is not equal to Vset when this ramp down begins, then VfgØ will not equal Vset after Vp and Vefb reach ØV. Moreover, during the ramp down, the current that continues to flow through tunnel devices TeØ and TpØ is typically not the same. This further affects the final charge level on floating gate fgØ.

To overcome this limitation and thereby maintain the same charge level on floating gate fgØ during the ramping of Vefb and Vp to ground, the current in the erase and program tunnel devices must be the same during this time. In order to maintain the same current in both tunnel devices, the voltage across each of the tunnel devices must be the same, which means Vefb must ramp down to ØV at the same rate as Vp ramps up to ØV. Also the tunnel device characteristics must be well matched.

Figure 8:
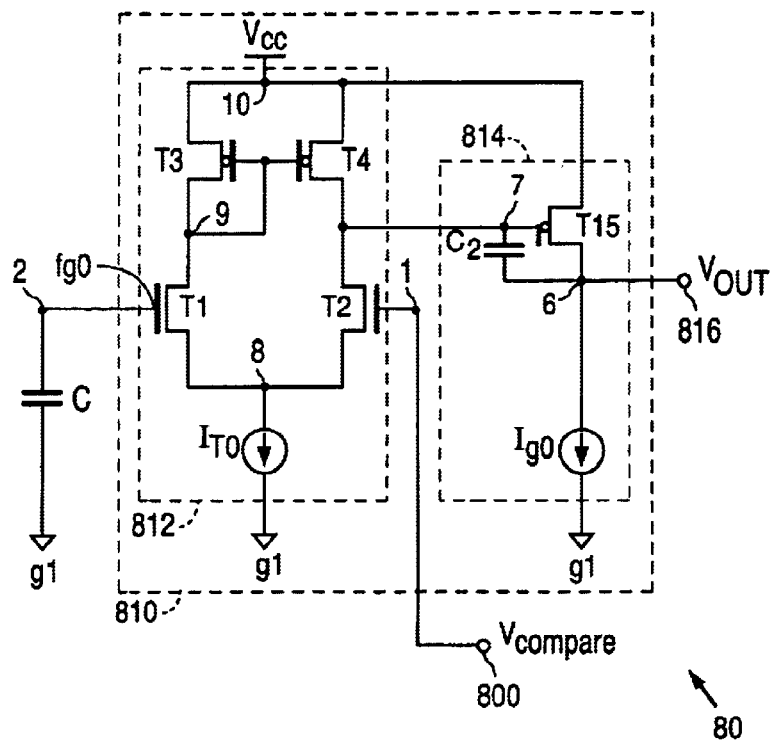
FIG. 8 is a circuit diagram of a voltage comparator circuit according to another embodiment of the present invention.

Accordingly, circuit 30 should be powered down, at step 46, in the following preferred manner. Once circuit 320 and the feedback circuit have stabilized for a time and it is clear that further accuracy to setting VfgØ is limited primarily by the charge pump noise, shown beginning at t₂, IpØ is shut off at t₃ to eliminate the pump noise. However, HV+, and thereby current source I2, are left on such that the feedback circuit is still active and continues to control Vefb. At the point when the negative charge pump is shut off, tunnel current continues to flow through TeØ and TpØ as CpØ discharges, which pulls up Vp back towards ØV. This tunnel current and the capacitance CpØ determine the ramp rate on Vp. As Vp ramps up, the voltage on floating gate fgØ is capacitively coupled upwards. Circuit 320 senses VfgØ moving upwards and ramps Vefb down towards ØV through the feedback circuit. As Vefb ramps down and Vp ramps up, the tunnel current in tunnel devices TeØ and TpØ decreases rapidly due to the steep slope of their Fowler-Nordheim tunnel device characteristics. Since feedback response time depends directly on the current in the erase tunnel device, the feedback circuit response slows down as Vefb ramps down. As the tunnel current decreases, both the ramp rate and feedback response times slow down and VfgØ gradually moves closer to Vset. For instance, FIG. 8 shows that VfgØ has converged to within about 0.5 mV of Vset for a set mode time of 30 mSec, and VfgØ may be set even more accurately by allowing a ramp down time of greater than 30 mSec. After VfgØ is allowed to converge on Vset for an amount of time determined by the level of accuracy desired, the HV+ voltage supply and thereby the I2 current source can be shut off, for instance at t₄, without affecting the charge on fgØ. Moreover, Vcc may be shut off. In other words, once VfgØ is detected as being within a predetermined threshold level of Vset, a steady state condition has been reached and power to circuit 30 can be shut off without affecting the value of VfgØ.

It is important that the response of the feedback circuit is slow enough to assure VfgØ is always slightly above Vset so circuit 320 and the feedback circuit continue to ramp Vefb down. If VfgØ goes below Vset and the feedback switches the direction Vefb is ramping, the feedback system will start to oscillate very slowly and VfgØ will diverge from Vset instead of converge towards Vset. After Vefb and Vp have ramped a few volts towards ØV and VfgØ is very close to Vset, Vefb and Vp can be ramped to ØV quickly, as illustrated at time t₄ in FIGS. 5A–5D, by shutting off HV+ because the current in TeØ and TpØ is so low it no longer affects the charge on the floating gate fgØ. CpØ must be carefully set to assure that as Vp rises to ØV, the feedback path through the differential stage 322, gain stage 324, TFØ level shift and TeØ devices to floating gate fgØ is able to ramp down Vefb and move VfgØ closer and closer to Vset. If CpØ is too small: Vp rises very quickly; the delay through the feedback path causes Vefb to ramp down too slowly; and VfgØ will rise above Vset instead of converging towards Vset. If CpØ is too large, the response of the feedback path is too fast and Vefb is ramped down too much, such that VfgØ may undershoot which causes the circuit to oscillate slowly. If circuit 320 is allowed to oscillate, VfgØ will tend to diverge instead of converge towards Vset. Accordingly, CpØ is designed such that the feedback response time is slightly slower than the discharge rate of CpØ. Preferably CpØ should be set at about 2.4 pf.

At the end of the set mode, at time t₄, floating gate fgØ will then continue to indefinitely store the charge level programmed on floating gate fgØ during the set mode, subject to possible charge loss, e.g., due to detrapping of electrons or dielectric relaxation over time, without any external power being supplied to circuit 30. In addition, although in the example illustrated above VfgØ was set to be equal to Vset, those of ordinary skill in the art will realize that in another embodiment of the present invention, circuit 30 can be configured such that VfgØ is set to a voltage that is some other predetermined function of Vset.

FIG. 8 is a circuit diagram of a voltage comparator circuit 80 with a built-in voltage reference according to the present invention. Circuit 80 is one embodiment of circuit 30 of FIG. 3 in a read mode. Preferably the same circuit used to set floating gate fgØ is also used in the read mode. This is so that any offset voltage and temperature variations in the circuit are to first order zeroed out. In the read mode, the high voltage current and voltage sources HV+, IpØ, and I2 are turned off, and no tunnel current flows through TeØ and TpØ. Therefore, these elements and capacitor CpØ are effectively eliminated from circuit 30. Moreover, since the current source I2 that drives the feedback loop of circuit 30 is no longer active, the feedback loop is also effectively eliminated from circuit 30.

Circuit 80 therefore comprises an input terminal 800 at a node 1 for receiving a voltage Vcompare for comparing to the voltage on a floating gate fgØ, which is a function of the charge level stored on floating gate fgØ during the set mode. Also included in circuit 80 is a steering capacitor C1 coupled between floating gate fgØ and ground.

Circuit 80 further includes a circuit 810 that compares VfgØ, the voltage on the floating gate fgØ, with the voltage at node 1 and generates an output voltage Vout, at a node 6, that is a function of the difference between VfgØ and the voltage at node 1. Circuit 810 preferably includes a differential amplifier (or differential stage) 812 that is preferably configured to have an inverting input coupled to floating gate fgØ, a non-inverting input coupled to node 1, and an output at a node 7. Circuit 810 preferably further includes a gain stage 814 with an input coupled to node 7 and an output terminal 816, at node 6. The differential stage 812 compares the voltages received at its inputs and amplifies that difference, typically by a factor of 50 to 100. The gain stage 814 then further amplifies that difference by another factor of 100.

Referring again to FIG. 8, the differential stage 812 preferably includes enhancement mode transistors T1, T2, T3 and T4. T1 and T2 are preferably NMOS transistors that are reasonably well matched by layout, and T3 and T4 are preferably PMOS transistors that are reasonably well matched by layout. The sources of NMOS transistors T1 and T2 are coupled together at a node 8. The drain of NMOS transistor T1 is coupled to a node 9, and its gate is floating gate fgØ. The drain of NMOS transistor T2 is coupled to node 7, and its gate is coupled to node 1. PMOS transistor T3 is coupled common drain, common gate at node 9, with its source coupled to a node 10. The gate of PMOS transistor T4 is coupled to node 9. Its drain is coupled to node 7, and its source is coupled to node 10. A voltage supply Vcc, typically 3 to 5 volts, is coupled to node 10, and a current source ItØ is coupled between node 8 and ground g1 to cause transistors T1, T2, T3 and T4 to operate in either the prethreshold or linear region during the compare mode. Current source ItØ can be implemented using any number of conventional circuits.

The gain stage 814 preferably includes a PMOS pull-up transistor T5 biased by Vcc, and includes a current source pull-down load IgØ. The source of transistor T5 is coupled to node 10. Its gate is coupled to the differential stage PMOS pull-up T4 at node 7, and its drain is coupled to node 6. Current source pull-down load IgØ is coupled between node 6 and ground g1. The gain stage 814 also preferably includes a compensation capacitor C2 coupled between nodes 6 and 7. Current source pull-down load IgØ is preferably an active load using an NMOS current mirror or a depletion device. Using an active current source with relatively high output resistance, the gain stage 814 can provide a voltage gain of about 100. The output swing of the gain stage 814 is nearly full rail from ground to Vcc.

During a compare operation in the read mode, an analog input voltage Vcompare is applied to the input terminal 800 at node 1. In the read mode, comparator circuit 80 then functions as follows. If Vcompare goes slightly higher than VfgØ, then more current flows through transistor T2 than transistor T1, and the voltage, V7, on node 7 drops below the voltage, V9, on node 9. This causes the current through transistor T5 to increase, which pulls Vout high. Since the gain of circuit 810 is about 8000, Vout goes right to Vcc. Similarly, when Vcompare is below the value of VfgØ, then Vout goes to ground. Vout will switch between the low and high state at the point when Vcompare is equal to VfgØ since at this point VfgØ=Vin.

Figure 9:
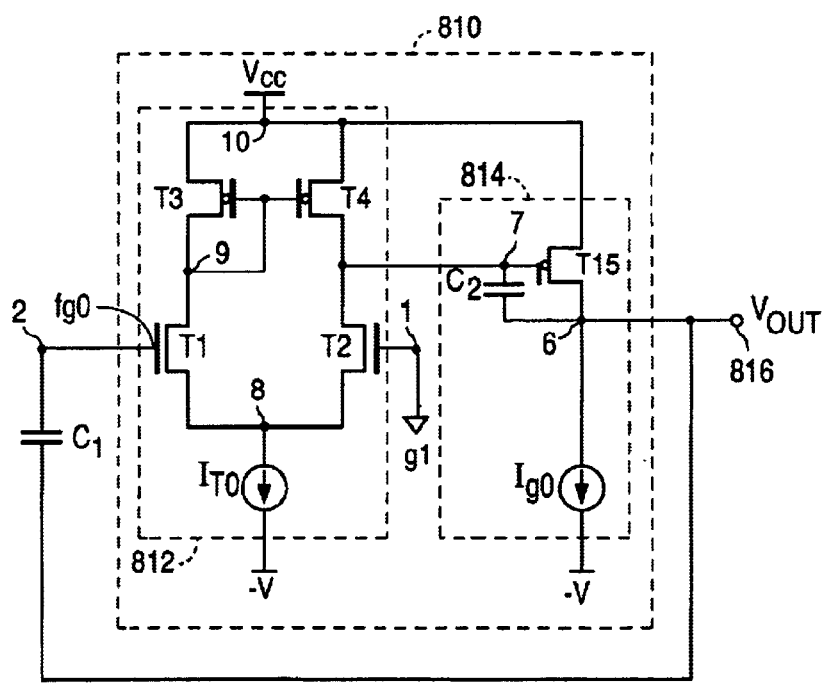
FIG. 9 is a circuit diagram of a voltage reference in a read mode according to another embodiment of the present invention.

FIG. 9 is a circuit diagram of a voltage reference circuit 90 according to the present invention. Circuit 90 is another embodiment of circuit 30 of FIG. 3 in the read mode. In the read mode, the high voltage source HV+ and the current sources IpØ, and I2 are turned off, and no tunnel current flows through TeØ and TpØ. Therefore these elements and CpØ are effectively eliminated from circuit 30. Moreover, since the current source I2 that drives the feedback loop of circuit 30 is no longer active, the feedback loop is also effectively eliminated from circuit 30.

The circuit elements in circuit 90 are identical to those illustrated in FIG. 8 and discussed above in reference to circuit 80. The difference between circuit 90 and circuit 80 is in how the input terminal 800 at node 1 is connected, how the bottom plate of steering capacitor C1 is connected, and how circuit 810 is biased during the read mode. During the read mode in circuit 90, the bottom plate of C1 is coupled to node 6 to form a negative feedback loop for circuit 810. Node 1 is preferably connected to ground, and current sources I+Ø and IgØ are respectively coupled between nodes 8 and 6 and a negative voltage −V, preferably −5 to −10V, which gives gain stage 814 a positive to negative output swing. With the negative feedback loop in place, Vout will go to the voltage necessary for circuit 810 to settle to a steady state condition such that VfgØ=V1 (voltage at node 1)=ØV, which is −Vset. Therefore, when circuit 810 settles, a reference voltage Vref is generated at node 6 of Vref=Vset. In this manner, circuit 90 may generate any reference voltage at node 6 without the need for additional amplifiers. Moreover, since circuit 90 is powered only by Vcc and ItØ, the maximum power draw is in the nanoamp range. This is a significant improvement over prior band gap voltage references.

Figure 10:
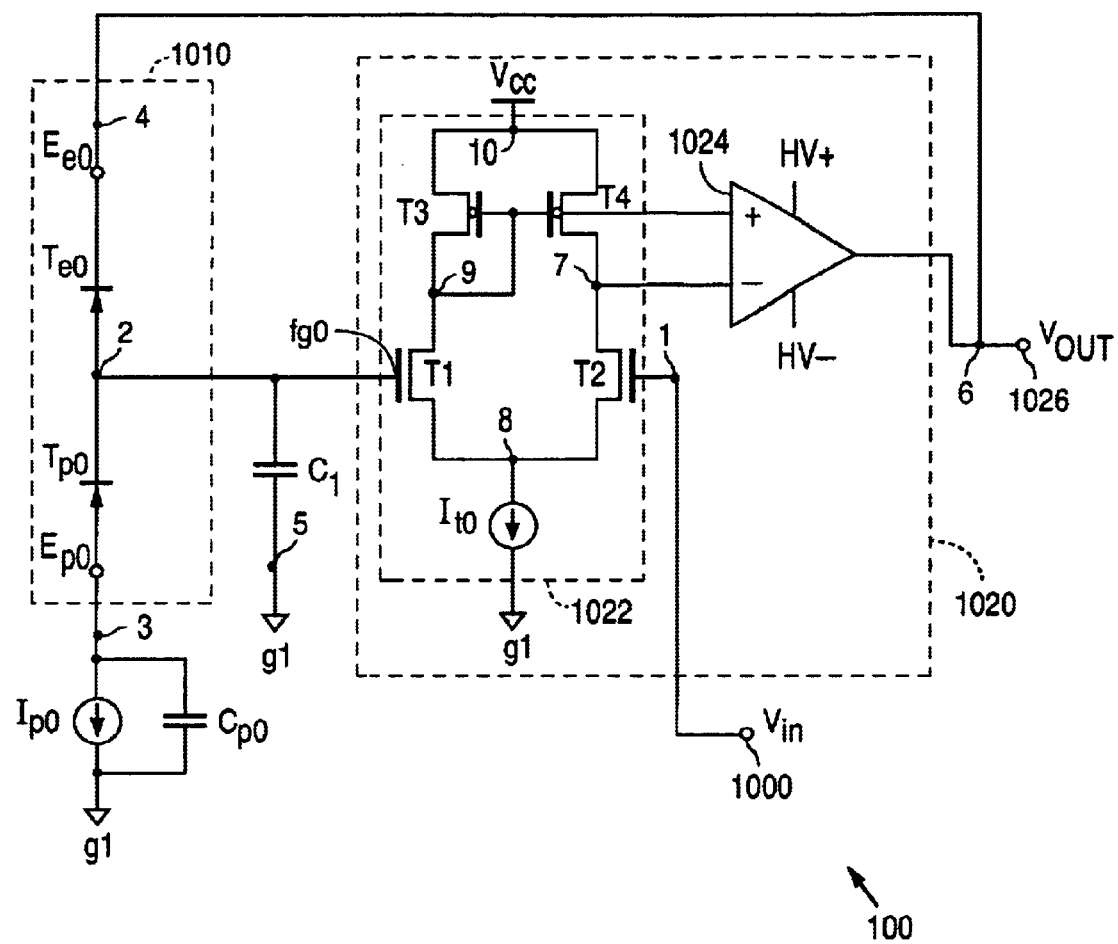
FIG. 10 is a circuit diagram of a differential floating gate circuit according to embodiment of the present invention.

FIG. 10 is a circuit diagram of a differential floating gate circuit 100 according to another embodiment of the present invention. Circuit 100 can be used to accurately set a floating gate to an analog voltage during a high voltage set mode. Once the voltage level is set, circuit 100 can then be configured during a read mode as a voltage comparator circuit with a built-in voltage reference or as a voltage reference circuit.

The elements of circuit 100 are identical to those of circuit 30 in FIG. 3 with the exception of the gain stage and the feedback loop. Circuit 100 comprises a floating gate fgØ at a node 2 that, at the conclusion of a set mode, is preferably set to a voltage that is approximately equal to an input set voltage Vin received at an input terminal 1000 coupled to a node 1. Circuit 100 further comprises a circuit 1010 that includes: a programming tunnel device TpØ formed between floating gate fgØ and a programming electrode EpØ, at a node 3; an erase tunnel device TeØ formed between floating gate fgØ and an erase electrode EeØ, at a node 4; and a steering capacitor C1 coupled between floating gate fgØ and a node 5.

Preferably programming electrode EpØ receives a negative voltage during the set mode, and erase electrode EeØ receives a positive voltage during the set mode. Moreover, TpØ and TeØ are preferably Fowler-Nordheim tunnel devices that are reasonably well matched by layout. The bottom plate of steering capacitor C1 is coupled to a predetermined voltage during the set mode that is preferably ground g1. Steering capacitor C1 is used to provide a stable ground reference for floating gate fgØ.

Circuit 100 further includes a circuit 1020 that compares VfgØ, the voltage on the floating gate fgØ, with the voltage at node 1 and generates an output voltage Vout, at a node 6, that is a function of the difference between VfgØ and the voltage at node 1. Circuit 1020 preferably includes a differential stage 1022 that is preferably configured to have an inverting input coupled to floating gate fgØ, a non-inverting input coupled to node 1, and an output at a node 7. Circuit 1020 preferably further includes a gain stage 1024 with an input coupled to node 7 and an output terminal 1026, at node 6. The differential stage compares the voltages received at its inputs and amplifies that difference, typically by a factor of 50 to 100. The gain stage then further amplifies that difference by more than a factor of 100. Moreover at the conclusion of the set mode, circuit 320 ideally settles to a steady state condition such that Vin=VfgØ.

Referring again to FIG. 10, the differential stage 1022 preferably includes enhancement mode transistors T1, T2, T3 and T4. Transistors T1 and T2 are preferably NMOS transistors that are reasonably well matched by layout, and transistors T3 and T4 are preferably PMOS transistors that are reasonably well matched by layout. The sources of NMOS transistors T1 and T2 are coupled together at a node 8. The drain of NMOS transistor T1 is coupled to a node 9, and its gate is floating gate fgØ. The drain of NMOS transistor T2 is coupled to node 7, and its gate is coupled to node 1. PMOS transistor T3 is coupled common drain, common gate to node 9, with its source coupled to a node 10. The gate of PMOS transistor T4 is coupled to node 9, its drain is coupled to node 7, and its source is coupled to node 10. A voltage supply Vcc, typically 3 to 5 volts, is coupled to node 10, and a current source It∅ is coupled between node 8 and ground g1 to cause transistors T1, T2, T3 and T4 to operate in the linear or pre-threshold region during the set mode. Current source It∅ can be generated using any number of conventional circuits.

The gain stage of circuit 100 is implemented using an external high impedance input CMOS OPAMP. Preferably, the inverting input of the CMOS OPAMP is coupled to the drain of transistor T2 of the differential stage, at node 7, and its non-inverting input is coupled to the drain of transistor T1 in the differential stage, at node 9. The CMOS OPAMP is biased by voltage supplies HV+ and HV−. Connected in this manner, the output Vout at node 6 goes high when Vfg∅ is lower than Vin, and Vout goes low when Vfg∅ is higher than Vin. Vout can be coupled to either erase electrode Ee∅ or programming electrode Ep∅ to control the voltage on fg∅. If coupled to erase electrode Ee∅, Vout needs to operate at about +14 to +19 volts, and if coupled to programming electrode Ep∅, Vout needs to operate at about −8 to −12 volts. FIG. 100 illustrates Vout being coupled to erase electrode Ee∅ to control the voltage on fg∅.

Circuit 100 also includes a feedback loop coupled between nodes 6 and 2. During the set mode, this feedback loop causes the voltage differential between tunnel electrodes Ee∅ and Ep∅ to be modified by modifying the voltage at node 4 as a function of the output voltage at node 6. The feedback loop is preferably achieved by coupling node 6 directly to the erase electrode Ee∅ at node 4.

Finally, circuit 100 also preferably includes current source Ip∅ and a capacitor Cp∅. Current source Ip∅ is connected between node 3 and ground g1. Ip∅ is preferably a P-Charnel charge pump that is used as a negative current source to pump a controlled tunnel current out of programming tunnel device Tp∅. Since Ip∅ is a current source, it automatically goes to whatever negative voltage at node 3 that is needed to establish the tunnel current at the desired level, assuming the current source has sufficient voltage compliance. Moreover, once the current through the tunnel devices is established, the voltage across the tunnel devices is also well defined by their Fowler-Nordheim characteristics. Therefore, Ip∅ produces Vp, the voltage at node 3, by controlling the current through tunnel device Tp∅. Using a current source Ip∅ is the preferred way to assure that tunnel devices Te∅ and Tp∅ are operating at a current level that is high enough to allow dual conduction, but low enough to avoid excessive current flow which damages the tunnel devices. Capacitor Cp∅ controls the discharge of current through the tunnel devices when Ip∅ is shut down at the conclusion of the set mode.

The differential floating gate circuit and method for programming described in the text above was chosen as being illustrative of the best mode of the present invention. All embodiments of the present invention described above are illustrative of the principles of the invention and are not intended to limit the invention to the particular embodiments described. Accordingly, while the preferred embodiment of the invention has been illustrated and described, it will be appreciated that various changes can be made therein without departing from the spirit and scope of the invention as claimed.

What is claimed is:

1. A floating gate circuit, comprising:
a floating gate having a voltage thereon;
a first tunnel device formed between said floating gate and a first tunnel electrode, and a second tunnel device formed between said floating gate and a second tunnel electrode for causing electrons to tunnel onto and off of said floating gate for modifying the voltage on said floating gate as a function of a voltage differential between said first and second tunnel electrodes;
a first circuit coupled to said floating gate for causing the voltage on said floating gate to be compared to a first voltage; and
a feedback circuit coupled between said floating gate and said first circuit for controlling said voltage differential such that the voltage on said floating gate is modified until said floating gate circuit reaches a steady state condition wherein the voltage on said floating gate is a predetermined function of said first voltage.

2. The floating gate circuit of claim 1, wherein said floating gate reaches a steady state condition such that the voltage on said floating gate is approximately equal to said first voltage.

3. The floating gate circuit of claim 1 further comprising:
a second circuit coupled to said first tunnel electrode for generating the voltage at said first tunnel electrode at the beginning of a set mode;
a third circuit coupled to said second tunnel electrode for generating the voltage at said second tunnel electrode during said set mode; and
a steering capacitor coupled between said floating gate and a second voltage during said set mode.

4. The floating gate circuit of claim 3, wherein said second voltage is ground.

5. The floating gate circuit of claim 3, wherein:
said third circuit comprises a first current source coupled between said second tunnel electrode and ground and a capacitor coupled in parallel with said first current source.

6. The floating gate circuit of claim 5, wherein said first current source is a charge pump.

7. The floating gate circuit of claim 1, said first circuit comprising:
a differential stage comprising a first, second, third and fourth transistor, each said transistor having a gate and a first and second terminal, wherein said floating gate is the gate of said first transistor, the gate of said second transistor is coupled to said first voltage, the first terminals of said first and second transistors are coupled together, the second terminals of said first and third transistors are coupled together and are further coupled to the gates of said third and fourth transistors, the second terminals of said second and fourth transistors are coupled together, and the first terminals of said third and fourth transistors are coupled together; and
a gain stage comprising a fifth transistor, having a gate and a first and second terminal, a current source, and a compensation capacitor, wherein the gate of said fifth transistor is coupled to the second terminals of said second and fourth transistors, the first terminal of said fifth transistor is coupled to the first terminals of said third and fourth transistors, the second terminal of said fifth transistor is coupled to said current source and to said feedback circuit; and said compensation capacitor is coupled between the gate and the second terminal of said fifth transistor.

8. The floating gate circuit of claim 7, wherein said first and second transistors are NMOS transistors, said third and fourth transistors are PMOS transistors, said fifth transistor is a PMOS pull-up transistor, and said current source is a pull-down load.

9. The floating gate circuit of claim 7, wherein said first and second transistors are PMOS transistors, said third and fourth transistors are NMOS transistors, said fifth transistor is an NMOS pull-down transistor, and said current source is a pull-up load.

10. The floating gate circuit of claim 1, wherein said first voltage is an input set voltage during a set mode and wherein said first voltage is a predetermined voltage during a read mode, said floating gate circuit reaching a steady state condition during said read mode wherein an output reference voltage is generated that is a function of said input set voltage.

11. The floating gate circuit of claim 10, wherein:
said floating gate circuit reaches a steady state condition during said set mode such that the voltage on said floating gate is approximately equal to said input set voltage; and
during said read mode said predetermined voltage is ground and said floating gate circuit reaches a steady state condition such that said floating gate voltage is approximately equal to ground for generating an output reference voltage that is approximately equal to the negative of said input set voltage.

12. The floating gate circuit of claim 1, wherein, during a set mode, said first voltage is a predetermined function of an input set voltage; said floating gate circuit further comprising:
a second circuit coupled to said floating gate for causing, during a read mode, the voltage on said floating gate to be compared to a second voltage and for generating an output voltage that switches between a high state and a low state as a function of whether said second voltage is above or below said first voltage.

13. The floating gate circuit of claim 12, wherein said output voltage switches between said high state and said low state as a function of whether said second voltage is above or below a value that is approximately equal to said input set voltage.

14. The floating gate circuit of claim 1, wherein, during a read mode, said feedback circuit for causing the voltage on said floating gate to be modified until said floating gate circuit reaches a steady state condition such that the voltage on said floating gate is a predetermined function of said first voltage for generating an output reference voltage during said read mode that is a predetermined function of said input set voltage.

15. A differential floating gate circuit, comprising:
a) a floating gate;
b) a first circuit coupled to said floating gate, said first circuit comprising a first tunnel device formed between said floating gate and a first tunnel electrode and a second tunnel device formed between said floating gate and a second tunnel electrode;
c) a second circuit operatively coupled to said floating gate and an input voltage terminal and having an output terminal; and
d) a feedback loop coupled between said output terminal and said first tunnel electrode, wherein during a set mode: said first circuit for causing said first and second tunnel devices to operate in a dual conduction mode, under the control of a voltage differential between the first and second tunnel electrodes, for modifying the charge level on said floating gate; said second circuit for comparing the voltage on said floating gate with an input set voltage at said input voltage terminal and generating an output voltage at said output terminal that is a function of the difference between said floating gate voltage and said input set voltage; said feedback loop for causing the voltage at said first tunnel electrode to be modified as a function of the output voltage, until said differential floating gate circuit reaches a steady state condition such that said floating gate voltage is approximately equal to said input set voltage.

16. The differential floating gate circuit of claim 15 further comprising a steering capacitor coupled between said floating gate and said output terminal during a read mode, wherein during said read mode: said second circuit for comparing the voltage on said floating gate with a predetermined voltage coupled to said input voltage terminal and for generating an output voltage at said output terminal that is a predetermined function of said input set voltage.

17. The differential floating gate circuit of claim 16, wherein said output voltage is approximately equal to the negative of said input set voltage.

18. The differential floating gate circuit of claim 15, wherein during a read mode: said second circuit for comparing the voltage on said floating gate with a compare voltage coupled to said input terminal and for generating an output voltage at said output terminal that switches between a high state and a low state as a function of whether said compare voltage is above or below a value that is a predetermined function of said input set voltage.

19. The differential floating gate circuit of claim 18, wherein said output voltage switches between a high and a low state as a function of whether said input compare voltage is above or below a value that is approximately equal to said input set voltage.

20. The differential floating gate circuit of claim 15, said second circuit comprising:
a differential stage comprising a first, second, third and fourth transistor, said differential stage configured such that said first transistor is disposed in an inverting leg and has as its gate said first floating gate and said second transistor is disposed in a non-inverting leg and has its gate coupled to said input voltage terminal, said differential stage further configured such that the source of said first transistor is coupled to the drain of said second transistor, and the drain of said first transistor is coupled to the gate and drain of said third transistor and to the gate of said fourth transistor, the drain of said second transistor is coupled to the drain of said fourth transistor, and the sources of said third and fourth transistors are coupled together; and
a gain stage coupled between said differential stage and said feedback loop for amplifying the difference between said floating gate voltage and said input set voltage.

21. The differential floating gate circuit of claim 20, wherein said first and second transistors are NMOS transistors and said third and fourth transistors are PMOS transistors.

22. The differential floating gate circuit of claim 21, said gain stage comprising a PMOS pull-up transistor, a current source pull-down, and a gain stage compensation capacitor, wherein the source of said PMOS pull-up is coupled to the sources of said third and fourth transistors, the gate of said PMOS pull-up is coupled to the drain of said fourth transistor, the drain of said PMOS pull-up is coupled to said feedback loop, to said current source pull-down, and to said output terminal, and said gain stage compensation capacitor is coupled between the gate and drain of said PMOS pull-up.

23. The differential floating gate circuit of claim 21, said gain stage comprising an external operational amplifier having an inverting input coupled to the drain of said fourth transistor, a non-inverting input coupled to the drain of said first transistor and an output coupled to said feedback loop and to said output terminal.

24. The differential floating gate circuit of claim 20, wherein said first and second transistors are PMOS transistors and said third and fourth transistors are NMOS transistors.

25. The differential floating gate of claim 15, wherein said differential floating gate circuit is fabricated using CMOS processing techniques.

26. The differential floating gate of claim 15, wherein said first tunnel device is designed by chip layout to approximately match said second tunnel device.

27. A differential floating gate circuit, comprising:
a) a floating gate;
b) a first circuit coupled to said floating gate, said first circuit comprising a first tunnel device formed between said floating gate and a first tunnel electrode and a second tunnel device formed between said floating gate and a second tunnel electrode;
c) a second circuit operatively coupled to said floating gate and an input voltage terminal and having an output terminal, said second circuit comprising:
a differential stage comprising a first, second, third and fourth transistor, said differential stage configured such that said first transistor is disposed in an inverting leg and has as its gate said first floating gate and said second transistor is disposed in a non-inverting leg and has its gate coupled to said input voltage terminal, said differential stage further configured such that the source of said first transistor is coupled to the drain of said second transistor, and the drain of said first transistor is coupled to the gate and drain of said third transistor and to the gate of said fourth transistor, the drain of said second transistor is coupled to the drain of said fourth transistor, and the sources of said third and fourth transistors are coupled together; and
a gain stage comprising a PMOS pull-up transistor, a current source pull-down, and a gain stage compensation capacitor, wherein the source of said PMOS pull-up is coupled to the sources of said third and fourth transistors, the gate of said PMOS pull-up is coupled to the drain of said fourth transistor, the drain of said PMOS pull-up is coupled to said current source pull-down and to said output terminal, and said gain stage compensation capacitor is coupled between the gate and drain of said PMOS pull-up; and
d) a feedback loop coupled between said output terminal and said first tunnel electrode, wherein during a set mode: said first circuit for causing said first and second tunnel devices to operate in a dual conduction mode, under the control of a voltage differential between the first and second tunnel electrodes, for modifying the charge level on said floating gate; said second circuit for comparing the voltage on said floating gate with an input set voltage at said input voltage terminal and generating an output voltage at said output terminal that is a function of the difference between said floating gate voltage and said input set voltage; said feedback loop for causing the voltage at said first tunnel electrode to be modified as a function of the output voltage, until said differential floating gate circuit reaches a steady state condition such that said floating gate voltage is approximately equal to said input set voltage.

28. In a floating gate circuit including a floating gate having a voltage thereon, a first tunnel device formed between said floating gate and a first tunnel electrode, and a second tunnel device formed between said floating gate and a second tunnel electrode for causing electrons to tunnel onto and off of said floating gate for modifying the voltage on said floating gate as a function of a voltage differential between said first and second tunnel electrodes, a method of setting the voltage on said floating gate comprising the steps of:
a) causing the voltage on said floating gate to be compared to a first voltage; and
b) causing the voltage on said floating gate to be modified using a feedback circuit until said floating gate circuit reaches a steady state condition such that the voltage on said floating gate is a predetermined function of said first voltage.

29. A method for programming a floating gate in a differential floating gate circuit to an input set voltage, said method comprising the steps of:
a) causing a first and second tunnel device coupled to said floating gate to operate in a dual conduction mode under the control of a voltage differential between a first tunnel electrode coupled to said first tunnel device and a second tunnel electrode coupled to said second tunnel device, for modifying the charge level on said floating gate;
b) comparing the voltage on said floating gate with an input set voltage at an input voltage terminal and generating an output voltage at an output voltage terminal that is a function of the difference between said floating gate voltage and said input set voltage; and
c) causing the voltage at said first tunnel electrode to be modified as a function of the output voltage via a feedback loop coupled between said output voltage and said first tunnel electrode and repeating steps (a) and (b) if said differential floating gate circuit has not reached a steady state condition such that said floating gate voltage is approximately equal to said input set voltage.

30. The method of claim 29, wherein step (a) further comprises causing the voltage at said second electrode to be generated using a negative charge pump.

31. The method of claim 30 further comprising the step of:
d) causing the voltage at said first tunnel electrode and the voltage at said second tunnel electrode to ramp toward a predetermined voltage such that said first and second tunnel devices are no longer in dual conduction.

32. The method of claim 31, wherein the voltages on said first and second tunnel electrodes are each ramped to zero volts.

33. The method of claim 31, wherein step (d) further comprises causing the voltages at said first and second tunnel electrodes to ramp toward said predetermined voltage at approximately the same rate.

34. The method of claim 33, wherein step (d) further comprises causing said charge pump to become inoperative while allowing said feedback circuit to remain operative until the voltages on said first and second tunnel electrodes have both ramped down to said predetermined voltage.

35. The method of claim 34, wherein step (d) further comprises causing the voltage at said second tunnel electrode to ramp toward said predetermined voltage as a function of a discharge rate of a capacitor coupled in parallel with said charge pump.

36. A method for programming a floating gate in a differential floating gate circuit to an input set voltage, said method comprising the steps of:

a) causing a first and second tunnel device coupled to said floating gate to operate in a dual conduction mode under the control of a voltage differential between a first tunnel electrode coupled to said first tunnel device and a second tunnel electrode coupled to said second tunnel device, for modifying the charge level on said floating gate;

b) comparing the voltage on said floating gate with an input set voltage at an input voltage terminal and generating an output voltage at an output voltage terminal that is a function of the difference between said floating gate voltage and said input set voltage;

c) causing the voltage at said first tunnel electrode to be modified as a function of the output voltage via a feedback loop coupled between said output voltage and said first tunnel electrode and repeating steps (a) and (b) if said differential floating gate circuit has not reached a steady state condition such that said floating gate voltage is approximately equal to said input set voltage; and d) causing the voltage at said first tunnel electrode and the voltage at said second tunnel electrode to ramp toward a predetermined voltage such that said first and second tunnel devices are no longer in dual conduction.

* * * * *